United States Patent [19]

Nakamura

[11] Patent Number: 5,291,576
[45] Date of Patent: Mar. 1, 1994

[54] SINGLE MODE OPTICAL WAVEGUIDE
[75] Inventor: Masanori Nakamura, Gifu, Japan
[73] Assignee: Ibiden Co., Ltd., Gifu, Japan
[21] Appl. No.: 77,549
[22] Filed: Jun. 17, 1993
[30] Foreign Application Priority Data Jun. 18, 1992 [JP] Japan .................. 4-185906

[51] Int. Cl.$^5$ .............................................. G02B 6/10
[52] U.S. Cl. .................................... 385/142; 385/130
[58] Field of Search ............... 385/130, 140, 141, 142, 385/143; 264/1.5, 2.7; 65/3.14; 156/600, 608; 427/163, 201

[56] References Cited

U.S. PATENT DOCUMENTS

| 3,563,630 | 2/1971 | Anderson et al. | 385/142 X |
| 4,265,667 | 5/1981 | Ikeda et al. | 385/142 X |
| 4,451,116 | 5/1984 | Pinnon et al. | 385/142 |
| 4,647,330 | 3/1987 | Rand | 385/142 X |
| 4,788,687 | 11/1988 | Miniscalco et al. | 385/142 X |
| 5,004,707 | 4/1991 | Ross et al. | 385/141 X |
| 5,046,801 | 9/1991 | Terashima et al. | 385/141 X |
| 5,158,823 | 10/1992 | Enomoto et al. | 428/216 |
| 5,175,784 | 12/1992 | Enomoto et al. | 385/122 |
| 5,185,829 | 2/1993 | Yamada et al. | 385/37 |

FOREIGN PATENT DOCUMENTS

| 3-213832 | 9/1991 | Japan . |
| 3-218997 | 9/1991 | Japan . |
| 4-12094 | 1/1992 | Japan . |
| 4-12095 | 1/1992 | Japan . |
| 4-37697 | 2/1992 | Japan . |
| 4-37698 | 2/1992 | Japan . |
| 4-204525 | 7/1992 | Japan . |

*Primary Examiner*—Akm E. Ullah
*Attorney, Agent, or Firm*—Sandler Greenblum & Bernstein

[57] ABSTRACT

A waveguide becomes a single mode waveguide under the condition as described below. If the $LiNbO_3$ waveguide includes an Na content in a range of 0.1 to 14.3 mol % and an Mg content in a range of 0.8 to 10.8 mol %, and provided that $T(\mu m)$ represents a thickness of the waveguide, and $\lambda$ ($\mu m$) represents a wavelength of the guided wave, then the relationships in the following equations are preferable, in the case of TM mode, $1.9 < (T+0.7)/\lambda < 5.7$ $(T>0)$ in the case of TE mode, $0.29 < (T+0.04)/\lambda < 1.19$ $(T>0)$.

2 Claims, 2 Drawing Sheets

FIG_1a
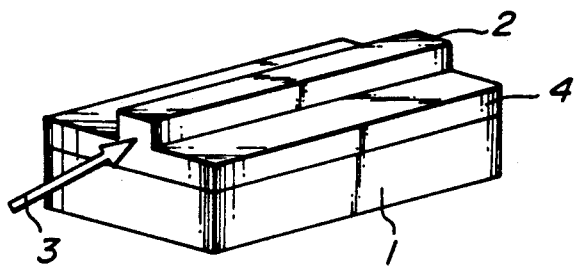
FIG_1b
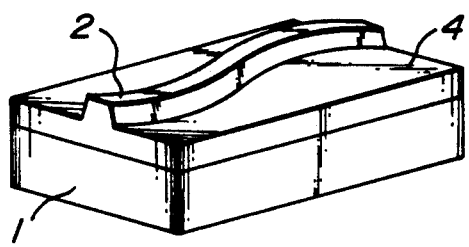
FIG_1c
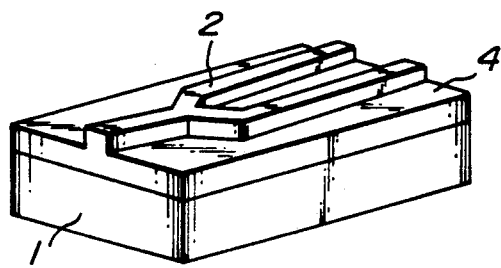
FIG_1d
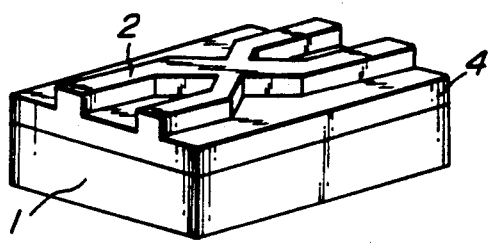
FIG_1e
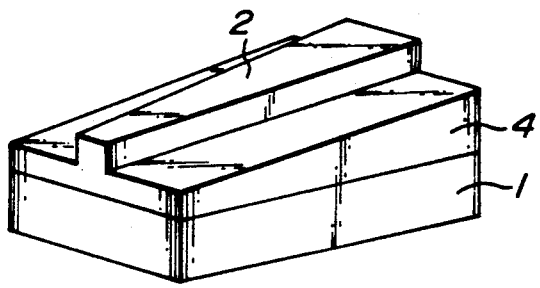

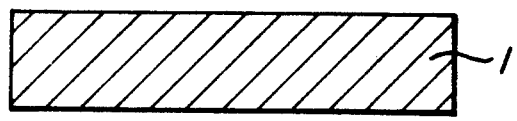
FIG_2a
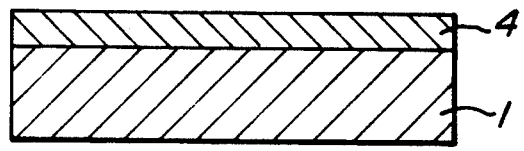
FIG_2b
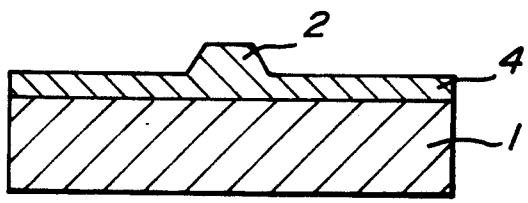
FIG_2c

SINGLE MODE OPTICAL WAVEGUIDE

BACKGROUND OF THE INVENTION

1. Field of the Invention

The present invention relates to a single mode optical waveguide, more particularly relates to an optical waveguide for use as an optical modulator and an optical switch in an optical integrated circuit used in an optical fiber communication system, an optical information processing system, an optical sensing system, an optical data registration system and the like.

2. Description of the Related Art

Recently, due to progresses of a single mode optical fiber and a single wavelength laser, a high speed optical data transmission of G b/s has practically been utilized. In particular, the optical waveguide device, which is superior in a high adaptability with the single mode optical fiber, holds a key to a future development of the optical fiber communication system.

In the field of the optical communication system, in order to build up the optical fiber communication networks, it is necessary to develop the optical device such as an optical matrix switch, the optical modulator or the like. The single mode optical waveguide is a component of such an optical device.

As an optical device, hithertofore, a number of optical devices using a Ti diffused $LiNbO_3$ channel waveguide have been developed. $LiNbO_3$ is generally utilized as an optical device using the electro-optical effect, since it has a relatively larger electro-optical constant among stable inorganic optical crystals. A Ti diffusion method and a proton exchange method are well known as a method of forming a waveguide.

Such an optical device is constructed by utilizing a single mode channel waveguide capable of transmitting only a fundamental mode in order to prevent unnecessary mode conversion due to interference and little disturbance between modes in waveguide.

As a material for constructing the optical device, as described above, $LiNbO_3$ is desirable and actually used. However, in such a $LiNbO_3$, (1) a $LiNbO_3$ optical waveguide produced by the Ti diffusion method can not perform waveguiding of a short wave length or a visible light due to its a large optical damage, and (2) a $LiNbO_3$ optical waveguide produced by the proton exchange method has a different crystallizability from that of a virgin $LiNbO_3$, after the waveguide has been formed, so that together with the other reason, an electro-optic constant is smaller than that of a bulk crystal (or $LiNbO_3$). Accordingly, when such an optical waveguide is used as the optical device for an optical switch or a directional coupler and the optical modulator or the like, then problem has arisen in an inability to realize the electric-power-saving and the downsizing since a larger switching voltage and a longer effective length are required.

While, the Ti diffused $LiNbO_3$ waveguide is formed by diffusing Ti at 1000° C., and the proton exchanged $LiNbO_3$ waveguide is also formed by performing the proton exchange at about 200° C. Therefore, when the temperature arises up to the Curie point of the $LiNbO_3$ for these waveguides, there is a problem that the Ti or Proton are more diffused enough to change a waveguide mode profile or to eliminate a presence of the waveguide mode.

Then, the present inventors have found that as shown in Japanese Patent Application Opened No. 12,095/92, the above problem is caused by a lower electro-optic effect caused from lattice mismatch between a substrate and a crystalline material forming the waveguide. In order to solve the above problem, the lattice match between the $LiTaO_3$ monocrystalline substrate and the $LiNbO_3$ monocrystalline thin film waveguide layer is performed by including an Na content in a range of 0.1 to 14.3 mol % and an Mg content in a range of 0.8 to 10.8 mol % in the $LiNbO_3$ monocrystalline waveguide, thereby developing a method of producing an optical device with a superior electro-optic effect.

In order to use such an optical waveguide as a practical device, as described above, the single mode optical waveguide must be obtained, but the above lattice matched $LiNbO_3$ waveguide developed by the present inventors has a different refractive index from that of the conventional $LiNbO_3$ waveguide so that conditions for single mode are different with each other and thus the $LiNbO_3$ waveguide obtained by the conventional design did not exhibit a single mode transmission.

SUMMARY OF THE INVENTION

It is an object of the present invention to overcome the above described disadvantages of the conventional single mode optical waveguide.

It is another object of the present invention to provide a single mode optical waveguide capable of transmitting only a fundamental mode.

The present invention is based on the fact that the relationship between the thickness of the optical waveguide and the wavelength dispersion in the single mode region is found by test and if the optical waveguide is formed in the region that the wavelength and the thickness of the optical waveguide satisfies a particular equation, a preferred single mode waveguide can be obtained and thus it can be applied to not only a passive optical device, but also to an active optical device using an electro-optic effect, a thermo-optic effect, an acousto-optic effect or the like.

According to the present invention, there is provided a single mode optical waveguide comprising a crystal of $LiNbO_3$ thin film waveguide layer including at least an Na content in a range of 0.1 to 14.3 mol % and an Mg content in a range of 0.8 to 10.8 mol % therein, thereby lattice matching $LiNbO_3$ thin film waveguide layer and $LiTaO_3$ single crystal substrate, the following relationship is satisfied;

in the case of TM mode, $$1.9 < (T+0.7)/\lambda < 5.7 (T>0)$$

in the case of TE mode, $$0.29 < (T+0.04)/\lambda < 1.19 \ (T>0)$$

where T(μm) represents a thickness of the waveguide layer, and λ (μm) a guided wavelength.

In a preferred embodiment of the single mode optical waveguide according to the present invention, the shape of the ridge-type optical waveguide satisfies the following relationship;

in the case of TM mode, $$W \leq (4\lambda - 0.5) \times (\lambda^2/\Delta T + 2.0)$$

in the case of TE mode, $$W \leq (0.04\lambda^3 + 0.1\lambda^2)/\Delta T + 2.5\lambda$$

where W(μm) represents a width of the waveguide, ΔT(μm) represents an etching depth.

According to the present invention, it is found that Na and Mg are included in the LiNbO$_3$ monocrystal, so that the wavelength dispersion of refractive index n of LiNbO$_3$ satisfies following relationships;

in the case of TM mode, $$n = 2.086 + (0.00294/\lambda^5) - (0.0216/\lambda^4) + (0.0750/\lambda^3) - (0.120/\lambda^2) + (0.127/\lambda) + na$$

in this case, na takes different values for wavelength;

$$na = -0.01 \quad (\lambda > 0.53)$$

$$na = 0.0462 \times \lambda - 0.0345 \quad (\lambda \leq 0.53)$$

in the case of TE mode, $$n = 2.158 + (0.00224/\lambda^5) - (0.0156/\lambda^4) + (0.0580/\lambda^3) - (0.0856/\lambda^2) + (0.119/\lambda) + nb$$

in this case, nb takes different values for wavelength;

$$nb = 0.00175 \times \lambda - 0.00411 \quad (\lambda > 0.63)$$

$$nb = 0.0174 \times \lambda - 0.014 \quad (\lambda \leq 0.63)$$

where λ is wavelength (μm).

In this case, the relationship among wavelength λ of the guided wave, the thickness T (μm) of the thin film and guided mode is investigated, and it is found that a single mode transmission is obtained in the range of following conditions;

in the case of TM mode, $$1.9 < (T + 0.7)/\lambda < 5.7 \quad (T > 0)$$

in the case of TE mode, $$0.29 < (T + 0.04)/\lambda < 1.19 \quad (T > 0)$$

where T(μm) represents a thickness of the waveguide, and λ (μm) a wavelength of the guided wave.

According to the present invention, the waveguide is made as a single mode waveguide, it is possible to prevent a generation of unnecessary mode and an unstable phenomenon such as mode conversion due to disturbance. Also, an active device liable to control the waveguide light can be obtained by coupling the waveguide to the light source with a prism and by forming electrodes or the like.

Moreover, it is desirable to satisfy following condition;

in the case of TM mode, $$3.5 < (T + 0.7)/\lambda < 5.7 \quad (T > 0)$$

The reason thereof is that in the case of TM mode, Na and Mg are utilized in order to obtain the lattice matching, so that the refractive index of the LiNbO$_3$ monocrystal becomes smaller than that of the usual LiNbO$_3$ monocrystal. Moreover, an allowable width of the single mode becomes larger than that of the usual LiNbO$_3$ monocrystal waveguide and thus the manufacture thereof becomes easy.

If such a lattice matched ridge type LiNbO$_3$ waveguide is made to a channelized form, it exhibits a single mode transmission in the range of following relationship;

in the case of TM mode, $$W \leq (4\lambda - 0.5) \times (\lambda^2 / \Delta T + 2.0)$$

in the case of TE mode, $$W \leq (0.04 +^3 + 0.1\lambda^2)/\Delta T + 2.5\lambda$$

where W(μm) represents a width of the waveguide, ΔT(μm) represents an etched depth of the ridge portion.

Such a channelizing may contain the light in more smaller region, so that if the light source is coupled to the waveguide through optical fibers or lenses and electrodes are applied thereto, a small active device for controlling the waveguided light can easily be formed by using the electro-optic effect, a thermo-optic effect, the acousto-optic effect or the like.

The matching of the lattice length means that the lattice constant of the LiNbO$_3$ monocrystal is adjusted and placed within a range of 99.81 to 100.07%, preferably 99.92 to 100.03% of the lattice constant of the LiTaO$_3$ monocrystal.

With such a construction, it can prevent a strain (or crystal defect, lattice defect) caused by growing the LiNbO$_3$ monocrystal with a liquid phase epitaxial method, thereby obtaining an LiNbO$_3$ monocrystal waveguide having an electro-optic effect equivalent to that of a bulk of an LiNbO$_3$ monocrystal.

A method of effecting such a lattice match may preferably be a method that the inventors have proposed in the International Patent Application Number PCT/JP/90/01207. There are (1) a method of containing Na and Mg into the LiNbO$_3$ monocrystal; (2) a method of varying a ratio of Li and Nb in a range of 41/59 to 56/44; (3) a method of reducing the lattice length of the LiTaO$_3$ monocrystalline substrate by Ti doping or the like. In this case, the first method (1) is most preferable, since the lattice constant of the LiTaO$_3$ monocrystalline substrate is larger than that of the LiNbO$_3$ monocrystal, so that the lattice constant of the LiNbO$_3$ monocrystal can be increased by containing Na and Mg thereinto.

When Na and Mg are contained in the LiNbO$_3$ monocrystal, the contents thereof may preferably be Na of 0.1 to 14.3 mol %, and Mg of 0.8 to 10.8 mol %.

A surface (0001) of the LiNbO$_3$ monocrystalline waveguide must be formed to be laminated on a surface (0001) of the LiTaO$_3$ monocrystalline substrate.

In the step of the producing process of optical waveguide according to the present invention, an impurity of transition metals or the like being a cause of optical damage are not doped into the optical waveguide layer, so that the optical damage thereof is smaller than that of the waveguide produced by the Ti diffusion method and thus visible light can also be guided without propagation loss.

Such an optical waveguide according to the present invention has a property that heat resistant is superior and properties of the waveguide are not changed even after the temperature arises up to the Curie point of the LiNbO$_3$, since the impurity is not diffused and the lattice matching of the crystals of the substrate and the waveguide is not performed.

BRIEF DESCRIPTION OF THE DRAWINGS

FIGS. 1a~1e are perspective views of optical modulators according to the present invention; and FIGS. 2a~2c are cross-sectional views showing processes of manufacturing a single mode optical waveguide according to the present invention.

DETAILED EXPLANATION OF THE PREFERRED EMBODIMENT

The optical waveguide according to the present invention is a channel type optical waveguide which is made in the form of a straight line type, a bending type, a Y branch type, an X branch type, a tapered type or the like.

As described above, the optical waveguide according to the present invention may serves as an optical waveguide constituting various optical devices.

A method of producing an optical waveguide according to the present invention will be described as follows.

As a method of producing $LiNbO_3$ monocrystalline waveguide, there is used a method of forming the $LiNbO_3$ monocrystalline film on the $LiTaO_3$ monocrystalline substrate 1, while both being allowed to receive lattice match, thereafter removing a surplus portion by masking using the Ti or the like and dry-etching on the waveguide formed portion, thus forming the waveguide 2. (see FIG. 2)

The method of forming the $LiNbO_3$ monocrystalline thin film, while being allowed to receive lattice match is achieved by contacting the $LiTaO_3$ monocrystalline substrate 1 with a melt consisted of lithium oxide-vanadium pentoxide-niobium pentoxide-sodium oxcide-magnesium oxide.

This producing method has been described in Japanese Patent Application Opened No. 12,095/1992.

EXAMPLE 1

(1) Two mol % of MgO with respect to a theoretical quantity of $LiNbO_3$ which could be separated out from a melt composition was added to a mixture consisting of $Na_2CO_3$ 22 mol %, $Li_2CO_3$ 28 mol %, $V_2O_5$ 40 mol % and $Nb_2O_5$ 10 mol %, a resultant mixture material was put into a platinum crucible, the mixture within which was heated up to 1100° C. and melted under an air atmosphere within an epitaxial growth forming system, i.e., furnace. The resultant obtained melt in the crucible was stirred over 12 hours at a rotating speed of 100 rpm with a propeller.

(2) A (0001) surface of an $LiTaO_3$ monocrystal with a thickness of 2 mm was polished.

(3) Then, the melt is gradually cooled down to 915° C. at a cooling rate of 60° C. per hour, and then the substrate 1 was preliminarily heated at 915° C. over 30 minutes, and dipped into the melt while rotating it at 20 rpm during 5 minutes. A growth rate of the $LiNbO_3$ was 1 μm per minute.

(4) The substrate 1 was taken up from the melt, and a surplus melt was shaken away by being rotated at 1000 rpm during 30 seconds, and then gradually cooled to a room temperature at a cooling rate of 1° C. per minute, as a result, an $LiNbO_3$ monocrystalline thin film with Na and Mg contents of about 5 μm thickness was formed on the substrate material.

(5) The Na and Mg contents contained in thus obtained $LiNbO_3$ monocrystalline thin film are 3 mol % and 2 mol % respectively. A lattice length ("a" axis) of the thin film was 5.156 Å, an extraordinary refractive index measured by an guided light with a wavelength of 1.15 μm was 2.235±0.001.

(6) A propagation loss of the thus obtained slab type waveguide was measured by a prism coupling method, where a propagation loss thereof was less than 1 dB per cm with a wavelength of 0.83 μm at a TM mode.

(7) A portion of the waveguide was patterned and Ti mask was formed by a photolithography technique, and a ridge type channel waveguide was produced by Ar plasma etching. The shape of the waveguide had a width of 10 μm with an etching depth of 1 μm.

(8) The optical waveguide thus produced was coupled to a laser beam of a wavelength of 1.55 μm at TM mode where its waveguide mode was a single one, and a propagation loss measured by a prism coupling method was less than 1 dB per cm. It has been found as a result of measurement that a deterioration with age of an emitting light was not changed at least during the time of 24 hours.

(9) The thus obtained waveguide satisfies following relationship among the required wavelength λ (μm) described above, the thickness T (μm) of the waveguide and the width W (μm) of the waveguide;

$$4.73 < T < 8.14$$
$$W < 25.09$$

(10) Further, this optical waveguide was kept at 1000° C. during the time of 12 hours in a water vapor atmosphere, and again coupled to the laser beam with the wavelength of 1.55 μm at TM mode, where its waveguide mode was a single one and a propagation loss thereof is the same value as that of the slab type waveguide. A deterioration with age of an emitting light was not changed at least during the time of 24 hours as a result of measurement.

(11) A silica buffer layer was deposited on the optical waveguide 2 obtained in the above process by the CVD method, and aluminium electrode was formed on the waveguide by the photolithography and vapor deposition techniques. An electro-optic constant (r33) of this optical waveguide was 30 pm/V, which was substantially equal to a value of a bulk $LiNbO_3$ monocrystal as a result of a practical measurement.

EXAMPLE 2

(1) Five mol % of MgO with respect to a theoretical quantity of $LiNbO_3$ which could be separated out from the melt composition was added to a mixture consisting of $Li_2CO_3$ 44.3 mol %, $V_2O_5$ 46.4 mol %, $Nb_2O_5$ 9.3 mol %, and $Na_2CO_3$ 27.2 mol % relative to $Li_2CO_3$, a resultant mixture material was put into a platinum crucible, the mixture within which was heated up to 1050° C. and melted under the air atmosphere within the epitaxial growth forming system. The resultant obtained melt in the crucible was stirred during 20 hours at a rotating speed of 100 rpm with the propeller.

(2) A (001) face of an $LiTaO_3$ monocrystal with a thickness of 1 mm was polished.

(3) Then, the melt is gradually cooled down to 915° C. at a cooling rate of 60° C. per hour, and then the substrate 1 was preliminarily heated at 915° C. over 30 minutes, and dipped into the melt while rotating it at 20 rpm during 1 minutes. A growth rate of the $LiNbO_3$ was 1 μm per minute.

(4) The substrate 1 was taken up from the melt, and a surplus melt was shaken away by being rotated at 1000 rpm during 30 seconds, and then gradually cooled to a room temperature at a cooling rate of 1° C. per minute, as a result, an LiNbO$_3$ monocrystalline thin film with Na and Mg contents of about 1 μm thickness was formed on the substrate material.

(5) The Na and Mg contents contained in thus obtained LiNbO$_3$ monocrystalline thin film are 3 mol % and 2 mol % respectively. A lattice length ("a" axis) of the thin film was 5.156 Å, an extraordinary refractive index measured by an guided light with a wavelength of 1.15 μm was 2.235 ±0.001.

(6) A propagation loss of the thus obtained slab type waveguide was measured by the prism coupling method, where a propagation loss thereof was less than 1 dB per cm with a wavelength of 0.83 μm at a TM mode.

(7) A portion of the waveguide was patterned by the photolithography techniqe and was masked with Ti mask, and a ridge type channel waveguide was produced by Ar plasma etching. The shape of the waveguide had a width of 1.5 μm with an etching depth of 0.3 μm.

(8) The optical waveguide thus produced was coupled to a laser beam of a wavelength of 1.55 μm at TM mode where its waveguide mode was a single one, and a propagation loss measured by the prism coupling method was less than 1 dB per cm. A deterioration with age of an emitting light was measured, where no variation was found at least during the time of 24 hours.

(9) The thus obtained waveguide satisfies following relationship among the required wavelength μ (μm) described above, the thickness T (μm) of the waveguide and the width W (μm) of the waveguide;

$$0.98 < T < 2.03$$
$$W < 3.93$$

(10) Further, this optical waveguide was kept at 1000° C. during the time of 12 hours in the water vapor atmosphere, and again coupled to the laser with the wavelength of 0.48 μm at TM mode, where its waveguide mode was a single one and a propagation loss thereof is the same value as that of the slab type waveguide. A deterioration with age of an emitting light was not changed at least during the time of 24 hours as a result of measurement.

(11) A silica buffer layer was deposited on the optical waveguide 2 obtained in the above process by the CVD method, and aluminium electrode was formed on the waveguide by the photolithography and vapor deposition techniques. An electro-optic constant (r33) of this optical waveguide was 30 pm/V, which was substantially equal to a value of a bulk LiNbO$_3$ monocrystal as a result of a practical measurement.

COMPARATIVE EXAMPLE 1

(1) Two mol % of MgO with respect to a theoretical quantity of LiNbO$_3$ which could be separated out from a melt composition was added to a mixture consisting of Na$_2$CO$_3$ 22 mol %, Li$_2$CO$_3$ 28 mol %, V$_2$O$_5$ 40 mol % and Nb$_2$O$_5$ 10 mol %, a resultant mixture material was put into a platinum crucible, the mixture within which was heated up to 1100° C. and melted under an air atmosphere within an epitaxial growth forming system, i.e., furnace. The resultant obtained melt in the crucible was stirred over 12 hours at a rotating speed of 100 rpm with the propeller.

(2) A (001) surface of an LiTaO$_3$ monocrystal with a thickness of 2 mm was polished.

(3) Then, the melt is gradually cooled down to 915° C. at a cooling rate of 60° C. per hour, and then the substrate 1 was preliminarily heated at 915° C. over 30 minutes, and dipped into the melt while rotating it at 20 rpm during 5 minutes. A growth rate of the LiNbO$_3$ was 1 μm per minute.

(4) The substrate 1 was taken up from the melt, and a surplus melt was shaken away by being rotated at 1000 rpm during 30 seconds, and then gradually cooled to a room temperature at a cooling rate of 1° C. per minute, as a result, an LiNbO$_3$ monocrystalline thin film with Na and Mg contents of about 2 μm thickness was formed on the substrate material.

(5) The Na and Mg contents contained in thus obtained LiNbO$_3$ monocrystalline thin film are 3 mol % and 2 mol % respectively. A lattice length ("a" axis) of the thin film was 5.156 Å, an extraordinary refractive index measured by an guided light with a wavelength of 1.15 μm was 2.235±0.001.

(6) A propagation loss of the thus obtained slab type waveguide was measured by a prism coupling method, where a propagation loss thereof was less than 1 dB per cm with a wavelength of 0.83 μm at a TM mode.

(7) A portion of the waveguide was patterned and Ti mask was formed by a photolithography technique, and a ridge type channel waveguide was produced by Ar plasma etching. The shape of the waveguide had a width of 10 μm with an etching depth of 1 μm.

(8) The optical waveguide thus produced was coupled to a laser beam of a wavelength of 1.55 μm at TM mode, but the guided light was not observed.

(9) The thus obtained waveguide does not satisfy following relationship among the required wavelength λ (μm) described above and the thickness T (μm) of the waveguide;

$$4.73 < T < 8.14$$

COMPARATIVE EXAMPLE 2

(1) A mixture material consisting of Li$_2$CO$_3$ 50 mol %, V$_2$O$_3$ 40 mol %, and Nb$_2$O$_5$ 10 mol % was heated to 1000° C., thereby forming a melt. Then, this melt was gradually cooled to 915° C. at a cooling rate of 60° C. per hour, concurrently the substrate 1 was preliminary heated at 915° C. during 30 minutes, then dipped into the melt during 5 minutes while rotating at 30 rpm. A growth rate of the LiNbO$_3$ was 1 μm per minute.

(2) The substrate 1 was taken up from the melt, and a surplus melt was shaken away on the melt while rotating at 1000 rpm during 30 seconds, and then gradually cooled to the room temperature at a cooling rate of 1° C. per minute, resulting in an LiNbO$_3$ monocrystalline thin film of about 5 μm thickness formed on the substrate material.

(3) A propagation loss of the thus obtained slab type waveguide was measured by the prism coupling method, where a propagation loss thereof was less than 10 dB per cm with a wavelength of 0.83 μm at a TM mode.

(4) A surplus portion of the LiNbO$_3$ monocrystalline thin film was eliminated by an ion beam etching, thereby forming a ridge type LiNbO$_3$ monocrystalline waveguide. A shape of the waveguide had a width of 10 μm with an etching depth of 1 μm.

(5) The optical waveguide thus formed was coupled to a laser beam of a wavelength of 1.55 μm at TM mode where two waveguide modes were observed, and a propagation loss measured by the prism coupling method was 10 dB per cm, which is the same value as that of the slab type waveguide. A deterioraton with age of an emitting light was measured, where no variation was found at least during the time of 24 hours.

(6) A silica buffer layer was deposited on the optical waveguide 2 obtained in the above process by the CVD method, and aluminium electrode was formed on the waveguide by the photolithography and vapor deposition techniques. An electro-optic constant of this optical waveguide was a third of the value of a bulk $LiNbO_3$ monocrystal as a result of a practical measurement.

(7) Further, this optical waveguide was kept at 1000° C. during the time of 12 hours in the water vapor atmosphere, and micro-cracks were observed and thus could not coupled to the laser.

(8) This waveguide satisfies a following relationship between the required wavelength $\lambda$ ($\mu$m) described above and the thickness T ($\mu$m) of the waveguide;

$$4.73 < T < 8.14$$

(9) This optical waveguide did not contain Na and Mg so that the lattice matching of $LiTaO_3$ substrate and $LiNbO_3$ was not performed.

COMPARATIVE EXAMPLE 3

(1) A (001) surface of an $LiTaO_3$ monocrystal having a thickness of 1 mm was polished.

(2) A mixture material consisting of $Li_2CO_3$ 50 mol %, $V_2O_3$ 40 mol %, and $Nb_2O_5$ 10 mol % was heated to 1000° C., thereby forming a melt. Then, this melt was gradually cooled to 915° C. at a cooling rate of 60° C. per hour, concurrently the substrate 1 was preliminary heated at 915° C. during 30 minutes, then dipped into the melt during 5 minutes while rotating at 30 rpm. A growth rate of the $LiNbO_3$ was 1 $\mu$m per minute.

(3) The substrate 1 was taken up from the melt, and a surplus melt was shaken away on the melt while rotating at 1000 rpm during 30 seconds, and then gradually cooled to the room temperature at a cooling rate of 1° C. per minute, resulting in an $LiNbO_3$ monocrystalline thin film of about 5 $\mu$m thickness formed on the substrate material.

(4) A propagation loss of the thus obtained slab type waveguide was measured by the prism coupling method, where a propagation loss thereof was less than 10 dB per cm with a wavelength of 0.83 $\mu$m at a TM mode.

(5) A surplus portion of the $LiNbO_3$ monocrystalline thin film was eliminated by an ion beam etching, thereby forming a ridge type $LiNbO_3$ monocrystalline waveguide. A shape of the waveguide had a width of 10 $\mu$m with an etching depth of 1 $\mu$m.

(6) The optical waveguide thus formed was coupled to a laser beam of a wavelength of 1.55 $\mu$m at TM mode where two waveguide modes were observed, and a propagation loss measured by the prism coupling method was 10 dB per cm, which is the same value as that of the slab type waveguide. A deterioration with age of an emitting light was measured, where no variation was found at least during the time of 24 hours.

(7) A silica buffer layer was deposited on the optical waveguide 2 obtained in the above process by the CVD method, and aluminium electrode was formed on the waveguide by the photolithography and vapor deposition techniques. An electro-optic constant of this optical waveguide was one third of the value of a bulk $LiNbO_3$ monocrystal as a result of a practical measurement.

(8) Further, this optical waveguide was kept at 1000° C. during the time of 12 hours in the water vapor atmosphere, and a micro-crack was observed and thus it could not coupled to the laser.

(9) This waveguide satisfies a following relationship between the required wavelength $\lambda$ ($\mu$m) described above and the thickness T ($\mu$m) of the waveguide:

$$4.73 < T < 8.14$$

It is natural that even when the waveguide shown in the example 1 is formed so as to have the same size as that of the waveguide shown in the comparative example 3, a single mode transmission can not be obtained.

Table 1 shows measured results of the respective propers of the examples 1 and 2 as well as the comparative examples 1, 2 and 3.

In table 1, the mark ◯ in the field of an annealing resistance designates that waveguiding characteristic is not decreased, such as the waveguiding or can not be performed even after annealing and the waveguide is cracked. The mark × in the field of an annealing resistance designates that the light coupling can not be performed.

TABLE 1

| | Shape of Waveguide | | | | | Electro- | Annealing |
|---|---|---|---|---|---|---|---|
| | Thickness ($\mu$m) | Width ($\mu$m) | Etching Depth ΔT ($\mu$m) | Wavelength $\lambda$ ($\mu$m) | Waveguide Mode | Optic Constant | Resistance Property |
| Example 1 | 5 | 10 | 1 | 1.55 TM Mode | Single | Balk Value Common | ◯ |
| Example 2 | 1 | 1.5 | 0.3 | 0.48 TM Mode | Single | Balk Value Common | ◯ |
| Comparative Example 1 | 2 | 10 | 1 | 1.55 TM Mode | Cut Off | — | — |
| Comparative Example 2 | 5 | 10 | 1 | 1.55 TM Mode | Multi | Balk Value 1/10 | X |
| Comparative Example 3 | 3 | 10 | 1 | 1.55 TM Mode | Single | Balk Value 1/10 | X |

As described above, the optical waveguides according to the present invention can exhibit superior characteristics than the conventional optical waveguide.

Moreover, in the optical waveguide according to the present invention, since the lattice length is matched between the $LiNbO_3$ monocrystalline waveguide 2 and the $LiTaO_3$ crystal 1, then lattice defects are not formed in the $LiNbO_3$ monocrystalline waveguide 2. Further, unlike the case of the conventional impurity diffused optical waveguide such as the Ti diffused LiNbO$_3$ optical waveguide and the proton exchanged optical waveguide or the like, in the optical waveguide according to the present invention, impurity for forming the waveguide is not diffused, thereby exhibiting a superior annealing resistance (resistance to annealing).

As describer above, the optical waveguide according to the present invention is capable of preventing deterioration of an electro-optic constant and upgrading a resistance to the optical damage, and therefore it can be used as a high grade waveguide for the optical device such as an optical waveguide exhibiting a high annealing resistance can easily be obtained and thus extremely grater effects can be realized in an industrial field.

What is claimed is:

1. A single mode optical waveguide characterized by comprising a crystal of LiNbO$_3$ thin film waveguide layer including at least an Na content in a range of 0.1 to 14.3 mol % and an Mg content in a range of 0.8 to 10.8 mol %, thereby lattice matching LiNbO$_3$ thin film waveguide layer and LiTaO$_3$ single crystal substrate, and following relationship being satisfied;

in the case of TM mode, $$1.9 < (T+0.7)/\lambda < 5.7 \quad (T>0)$$

in the case of TE mode, $$0.29 < (T+0.04)/\lambda < 1.19 \quad (T>0)$$

where T($\mu$m) represents a thickness of the waveguide layer, and $\lambda$ ($\mu$m) a wavelength of the guided wave.

2. A single mode optical waveguide as claimed in claim 1, wherein the shape of the optical waveguide satisfies the following relationship;

in the case of TM mode, $$W \leq (4\lambda - 0.5) \times (\lambda^2/\Delta T + 2.0)$$

in the case of TE mode, $$W \leq (0.04\lambda^3 + 0.1\lambda^2)/\Delta T + 2.5\lambda$$

where W($\mu$m) represents a width of the waveguide, $\Delta T$($\mu$m) represents an etching depth.

* * * * *